United States Patent
Zou et al.

(10) Patent No.: US 10,587,241 B2
(45) Date of Patent: Mar. 10, 2020

(54) TEMPERATURE COMPENSATED ACOUSTIC RESONATOR DEVICE HAVING THIN SEED INTERLAYER

(71) Applicant: Avago Technologies International Sales Pte. Limited, Singapore (SG)

(72) Inventors: Qiang Zou, Fort Collins, CO (US); Chris Feng, Fort Collins, CO (US); John Choy, Westminster, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 734 days.

(21) Appl. No.: 15/084,278

(22) Filed: Mar. 29, 2016

(65) Prior Publication Data

US 2017/0288636 A1    Oct. 5, 2017

(51) Int. Cl.
*H01L 41/18* (2006.01)
*H03H 9/02* (2006.01)
*H03H 9/17* (2006.01)
*H03H 9/13* (2006.01)

(52) U.S. Cl.
CPC ......... *H03H 9/02448* (2013.01); *H01L 41/18* (2013.01); *H03H 9/171* (2013.01)

(58) Field of Classification Search
CPC ...................................................... H03H 9/173
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,384,697 B1 | 5/2002 | Ruby | |
| 6,507,983 B1 | 1/2003 | Ruby et al. | |
| 7,275,292 B2 | 10/2007 | Ruby et al. | |
| 7,280,007 B2 | 10/2007 | Feng et al. | |
| 7,323,805 B2 * | 1/2008 | Sano ...................... | H01L 41/316 310/358 |

(Continued)

OTHER PUBLICATIONS

M. Kratzer, "Oerlikon PVD production solutions for piezoelectric materials," Oerlikon Systems R&D, Workshop PiezoMEMS Aachen,18./May 19, 2010, pp. 1-20.

*Primary Examiner* — Thomas M Dougherty
*Assistant Examiner* — Karen B Addison
(74) *Attorney, Agent, or Firm* — Sheridan Ross P.C.

(57) ABSTRACT

An acoustic resonator device includes a composite first electrode disposed over a substrate; a piezoelectric layer disposed on the composite first electrode, the piezoelectric layer including a piezoelectric material doped with scandium for improving piezoelectric properties; and a second electrode disposed on the piezoelectric layer. The composite first electrode includes a base electrode layer disposed over the substrate; a temperature compensation layer disposed on the base electrode layer; a seed interlayer disposed on the temperature compensation layer, the seed interlayer having a thickness between about 5Å and about 150Å; and a conductive interposer layer disposed on at least the seed interlayer, at least a portion of the conductive interposer layer contacting the base electrode layer. The piezoelectric layer has a negative temperature coefficient and the temperature compensation layer has a positive temperature coefficient at least partially offsetting the negative temperature coefficient.

20 Claims, 7 Drawing Sheets

(56) References Cited

U.S. PATENT DOCUMENTS

| | | | |
|---|---|---|---|
| 7,345,410 B2 * | 3/2008 | Grannen | H03H 3/04 310/363 |
| 7,358,831 B2 | 4/2008 | Larson, III et al. | |
| 7,388,454 B2 | 6/2008 | Ruby et al. | |
| 7,482,737 B2 * | 1/2009 | Yamada | H03H 3/02 310/363 |
| 7,489,067 B2 * | 2/2009 | Metzger | B65B 3/003 310/358 |
| 7,561,009 B2 | 7/2009 | Larson, III et al. | |
| 7,629,865 B2 | 12/2009 | Ruby | |
| 8,330,556 B2 | 12/2012 | Miller et al. | |
| 8,692,631 B2 | 4/2014 | Zhang | |
| 8,981,876 B2 | 3/2015 | Jamneala et al. | |
| 2009/0053401 A1 | 2/2009 | Uppili et al. | |
| 2010/0327697 A1 | 12/2010 | Choy et al. | |
| 2010/0327994 A1 | 12/2010 | Choy et al. | |
| 2011/0180391 A1 | 7/2011 | Larson, III et al. | |
| 2011/0266925 A1 | 11/2011 | Ruby et al. | |
| 2012/0177816 A1 | 7/2012 | Larson, III et al. | |
| 2014/0292149 A1 | 10/2014 | Zou et al. | |
| 2014/0292150 A1 * | 10/2014 | Zou | H03H 9/02102 310/335 |

* cited by examiner

TEMPERATURE COMPENSATED ACOUSTIC RESONATOR DEVICE HAVING THIN SEED INTERLAYER

BACKGROUND

Electrical resonators are widely incorporated in modern electronic devices. For example, in wireless communications devices, radio frequency (RF) and microwave frequency resonators are used as filters, such as ladder filters having electrically connected series and shunt resonators formed in a ladder structure. The filters may be included in a duplexer, for example, connected between a single antenna and a receiver and a transmitter for respectively filtering received and transmitted signals.

Various types of filters use mechanical resonators, such as bulk acoustic wave (BAW) and surface acoustic wave (SAW) resonators. A BAW resonator, for example, is an acoustic stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). Types of BAW resonators include a film bulk acoustic resonator (FBAR), which uses an air cavity for acoustic isolation, and a solidly mounted resonator (SMR), which uses an acoustic mirror for acoustic isolation, such as a distributed Bragg reflector (DBR). FBARs, like other BAW devices, may be configured to resonate at frequencies in GHz ranges, and are relatively compact, having thicknesses on the order of microns and length and width dimensions of hundreds of microns. This makes FBARs well-suited to many applications in high-frequency communications.

Resonators may be used as band-pass filters with associated passbands providing ranges of frequencies permitted to pass through the filters. The passbands of the resonator filters tend to shift in response to environmental and operational factors, such as changes in temperature and/or incident power. For example, the passband of a resonator filter moves lower in frequency in response to rising temperature and higher incident power.

Cellular phones, for example, are negatively affected by shifts in passband due to fluctuations in temperature and power. For example, a cellular phone includes power amplifiers (PAs) that must be able to deal with larger than expected insertion losses at the edges of the filter (duplexer). As the filter passband shifts down in frequency, e.g., due to rising temperature, the point of maximum absorption of power in the filter, which is designed to be above the passband, moves down into the frequency range of the FCC or government designated passband. At this point, the filter begins to absorb more power from the PA and heats up, causing the temperature to increase further. Thus, the filter passband shifts down in frequency more, bringing the maximum filter absorbing point even closer. This sets up a potential runaway situation, which is avoided only by the fact that the reflected power becomes large and the filter eventually settles at some high temperature.

In order to prevent or reduce frequency shift with rising temperatures, a conventional resonator used in a band-pass filter, for example, may include a layer of oxide material within the piezoelectric layer of the acoustic stack and/or one or more electrodes, an example of which is provided by Ruby et al., U.S. Patent Application Pub. No. 2011/0266925 (published Nov. 3, 2011), which is hereby incorporated by reference in its entirety. The oxide material has a positive temperature coefficient of elastic modulus over a certain temperature range. The positive temperature coefficient of the oxide material at least partially offsets the negative temperature coefficients of the metal electrodes and the piezoelectric material, respectively. For example, the oxide material may be placed in the center of the piezoelectric layer or at either end of the piezoelectric layer between the electrodes. However, the acoustic coupling coefficient ($kt^2$) of the resonator is compromised by the addition of oxide material to the piezoelectric layer. This is because the oxide material appears as a "dead" capacitor in series with the active piezoelectric material dielectric. For example, when an oxide layer or other temperature compensation layer is inserted in an FBAR stack, the coupling coefficient $kt^2$ becomes lower as the temperature coefficient of the FBAR stack becomes more positive.

Furthermore, the piezoelectric layer may be grown over the oxide material used for temperature compensation. The temperature compensation layer is generally an amorphous film, and therefore is not an oriented crystalline material. As such, the piezoelectric layer grown on certain known temperature compensation layers (e.g., silicon dioxide) will have a poor crystalline structure and a random mixture of c-axis orientations in the thin film, which prevents good piezoelectric response. By contrast, it is desirable to form a highly textured C-axis piezoelectric material demonstrating excellent piezoelectric properties. In order to provide a highly textured C-axis piezoelectric material, a seed interlayer may be applied to the surface of the electrode or the temperature compensation layer over which the piezoelectric layer is grown.

In addition, a seed interlayer on the temperature compensation layer may help to improve the positive temperature coefficient and the coupling coefficient $kt^2$ of a temperature compensated FBAR structure. An example of a seed interlayer on a temperature compensation layer formed within a bottom electrode is provided by Zou et al., U.S. Patent Application Pub. No. 2014/0292150 (published Oct. 2, 2014), which is hereby incorporated by reference in its entirety. Generally, the thicker the seed interlayer, the more effective it is in providing highly textured C-axis piezoelectric material and improving the positive temperature coefficient, particularly with respect to a piezoelectric layer formed of commonly used aluminum nitride (AlN).

What is needed, therefore, is a temperature compensated acoustic resonator device that overcomes at least some of the noted shortcomings of known acoustic resonator devices described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Aspects of the present teachings are relevant to components of BAW and FBAR devices and filters, their materials and their methods of fabrication. Various details of such devices and corresponding methods of fabrication may be found, for example, in one or more of the following U.S. patent publications: U.S. Pat. No. 6,107,721 to Lakin; U.S. Pat. Nos. 5,587,620, 5,873,153, 6,507,983, 6,384,697, 7,275,292, 7,629,865 and 7,388,454 to Ruby et al.; U.S. Pat. No. 7,280,007 to Feng, et al.; U.S. Pat. No. 8,981,876 to Jamneala et al.; U.S. Patent App. Pub. Nos. 2010/0327697 and 2010/0327994 to Choy et al.; and U.S. Patent App. Pub. Nos. 2011/0180391 and 2012/0177816 to Larson, et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

According to various representative embodiments, a resonator device has an acoustic stack with a piezoelectric layer formed of aluminum nitride (AlN) doped with scandium (Sc) between top and bottom electrodes. At least the bottom electrode is a composite electrode having a temperature compensating layer deposited between an electrode layer and a conductive interposer layer, and a seed interlayer deposited on the temperature compensating layer and beneath the conductive interposer layer. As used herein, a material having a "positive temperature coefficient" means the material has positive temperature coefficient of elastic modulus over a certain temperature range. Similarly, a material having a "negative temperature coefficient" means the material has negative temperature coefficient of elastic modulus over the (same) certain temperature range.

The conductive interposer layer thus makes a DC electrical connection with the electrode layer in the composite electrode, effectively shorting out a capacitive component of the temperature compensating layer and increasing a coupling coefficient $kt^2$ of the resonator device. Also, the seed interlayer causes formation of a highly textured C-axis piezoelectric layer of Sc doped AlN material demonstrating excellent piezoelectric properties, where the piezoelectric properties generally improve as a thickness of the seed interlayer decreases (becomes thinner). The conductive interposer, which is positioned between the temperature compensating layer and the piezoelectric layer, presents a barrier preventing oxygen in the oxide layer from diffusing into the piezoelectric material of the piezoelectric layer.

According to a representative embodiment, an acoustic resonator device includes a composite first electrode disposed over a substrate; a piezoelectric layer disposed on the composite first electrode, the piezoelectric layer including a piezoelectric material doped with scandium for improving piezoelectric properties of the piezoelectric layer; and a second electrode disposed on the piezoelectric layer. The composite first electrode includes a base electrode layer disposed over the substrate; a temperature compensation layer disposed on the base electrode layer; a seed interlayer disposed on the temperature compensation layer, the seed interlayer having a thickness between about 10 Å and about 150 Å, for example; and a conductive interposer layer disposed on at least the seed interlayer, at least a portion of the conductive interposer layer contacting the base electrode layer. The piezoelectric layer has a negative temperature coefficient and the temperature compensation layer has a positive temperature coefficient that at least partially offsets the negative temperature coefficient of the piezoelectric layer.

Figure 1:
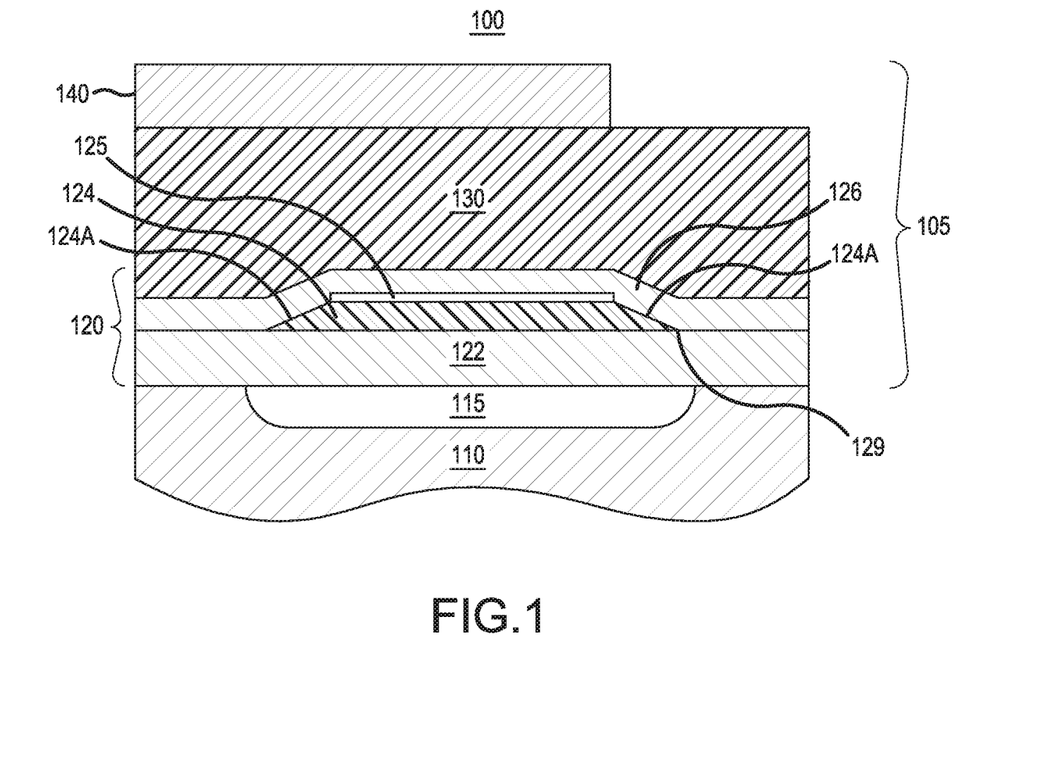
FIG. 1 is a cross-sectional diagram illustrating an acoustic resonator device, including an electrode with a buried temperature compensating layer and thin seed interlayer according to a representative embodiment.

FIG. 1 is a cross-sectional view of an acoustic resonator device, which includes an electrode having a buried temperature compensating layer and seed interlayer, according to a representative embodiment.

Referring to FIG. 1, illustrative acoustic resonator device 100 includes acoustic stack 105 formed on substrate 110. The substrate 110 may be formed of various types of materials compatible with wafer-scale processes, such as silicon (Si), gallium arsenide (GaAs), indium phosphide (InP), silicon dioxide, alumina, or the like, thus reducing the cost of the final part. In the depicted embodiment, the substrate 110 defines a cavity 115 formed beneath the acoustic stack 105 to provide acoustic isolation, such that the acoustic stack 105 is suspended over an air space to enable mechanical movement. In alternative embodiments, the substrate 110 may be formed with no cavity 115, for example, using SMR technology. For example, the acoustic stack 105 may be formed over an acoustic mirror or a distributed Bragg reflector (DBR) (not shown), having alternating layers of high and low acoustic impedance materials, formed in or on the substrate 110. An acoustic mirror may be fabricated according to various techniques, an example of which is described in U.S. Pat. No. 7,358,831 to Larson, III, et al., the disclosure of which is hereby incorporated by reference in its entirety.

The acoustic stack 105 includes piezoelectric layer 130 formed between composite first (bottom) electrode 120 and second (top) electrode 140. In the depicted embodiment, the composite first electrode 120 includes multiple layers, and thus is referred to as a "composite electrode." The composite first electrode 120 includes a base electrode layer 122 (first electrically conductive layer), a buried temperature compensation layer 124, a thin seed interlayer 125, and a conductive interposer layer 126 (second electrically conductive layer) stacked sequentially on the substrate 110. In a representative embodiment, the base electrode layer 122 and/or the conductive interposer layer 126 are formed of electrically conductive materials, such as various metals compatible with wafer processes, including tungsten (W), molybdenum (Mo), aluminum (Al), platinum (Pt), ruthenium (Ru), niobium (Nb), or hafnium (Hf), for example. In certain representative embodiments, at least one of the electrically conductive layers of the base electrode layer 122 and the conductive interposer layer 126 is made of a material that has a positive temperature coefficient. In accordance with a representative embodiment, the material having the positive temperature coefficient is an alloy. Illustratively, the alloy may be one of nickel-iron (Ni—Fe), niobium-molybdenum (NbMo) and nickel-titanium (NiTi).

In the representative embodiment, the thin seed interlayer 125 is disposed over the temperature compensation layer 124 and beneath the conductive interposer layer 126, and the piezoelectric layer 130 is disposed over the conductive interposer layer 126. The piezoelectric layer 130 is formed of AlN material doped with Sc (referred to as AlScN). In various embodiments, the AlScN piezoelectric layer 130 may include concentration of Sc in a range of approximately 5.0 atomic percent to approximately 12 atomic percent of the piezoelectric material, for example. The seed interlayer 125 functions as a seed interlayer to foster growth of a highly textured AlScN piezoelectric layer 130, and increases the coupling coefficient $kt^2$. More particularly, the coupling coefficient $kt^2$ increases as the thickness of the seed interlayer 125 decreases. The increase in coupling coefficient $kt^2$ helps to offset the reduction in coupling coefficient $kt^2$ resulting from inclusion of the temperature compensation layer 124. In addition, standard deviation of the coupling coefficients $kt^2$ of the acoustic resonators across the acoustic resonator device wafer (before singulation) generally decreases as the thickness of the seed interlayer 125 decreases, such that the coupling coefficients $kt^2$ are more constant across the acoustic resonator device wafer, which is not the case for conventional acoustic resonator device wafers with undoped AlN piezoelectric layers.

The temperature compensation layer 124 may be formed of various materials compatible with wafer processes, including silicon dioxide ($SiO_2$), borosilicate glass (BSG), fluorine doped $SiO_2$, chromium oxide ($Cr_{(x)}O_{(y)}$) or tellurium oxide ($TeO_{(x)}$), for example, which have positive temperature coefficients that offset at least a portion of the negative temperature coefficients of the piezoelectric layer 130 and the conductive material in the first and second electrodes 120 and 140. The seed interlayer 125, or seed interlayer, causes a highly textured piezoelectric layer 130 to grow with a highly oriented C-axis, substantially perpendicular to a growth surface of the conductive interposer layer. The seed layer 125 may be formed of AlN, for example. Alternatively, the seed interlayer 125 may be formed of materials with a hexagonal crystal structure (such as titanium, ruthenium), or a composition of the same piezoelectric material (e.g., AlScN) as the piezoelectric layer 130 and a hexagonal crystal structure material. As mentioned above, thinner the seed interlayer 125, the greater the increase in coupling coefficient $kt^2$ of the acoustic stack 105. Thus, the seed interlayer 125 has a thickness in a range of about 5 Anstroms (Å) to about 150 Å. In an embodiment, the seed interlayer 125 has a thickness in a range between about 20 Å and about 50 Å, for example. Accordingly, the coupling coefficient $kt^2$ is increased (improved) by incorporating Sc doped AlN material as the piezoelectric layer 130 and by inclusion of the seed interlayer 125, collectively offsetting at least a portion of the reduction in the coupling coefficient $kt^2$ caused by inserting the temperature compensation layer 124 in the acoustic stack 105.

Notably, without the seed interlayer 125, a piezoelectric layer 130 formed of Sc doped AlN has poor growth quality on the composite first electrode 120 (including temperature compensation layer 124), than grown on a first electrode with no temperature compensation. That is, the material selected for the conductive interposer layer 126 should be selected so as to not adversely impact the quality of the crystalline structure of the piezoelectric layer 130, as it is desirable to provide a highly textured (well oriented C-axis) piezoelectric layer 130 in the acoustic stack 105. It has thus been beneficial to use a material for the conductive interposer layer 126 that will allow growth of a highly textured piezoelectric layer 130. However, the addition of the seed interlayer 125 can reduces or eliminates the need for selecting a material for the conductive interposer layer 126 that does not adversely impact the crystalline orientation of the piezoelectric layer 130. In various embodiments, the base electrode layer 122, the conductive interposer layer 126 and the second electrode 140 may be made from one or more materials having a positive temperature coefficient to further reduce or substantially prevent the adverse impact on frequency at higher temperatures of operation. That is, the positive temperature coefficient of the selected base electrode layer 122, or the conductive interposer layer 126, or both, beneficially offsets negative temperature coefficients of other materials in the acoustic stack 105, including for example the piezoelectric layer 130, the second electrode 140, and any other layer of the acoustic stack that has a negative temperature coefficient. Beneficially, the inclusion of one or more layers of materials having the positive temperature coefficient for electrically conductive layers in the acoustic stack allows the same degree of temperature compensation with a thinner buried temperature compensation layer 124.

In various embodiments, the base electrode layer 122 and the conductive interposer layer 126 are formed of different conductive materials, where the base electrode layer 122 is formed of a material having relatively lower conductivity and relatively higher acoustic impedance, and the conductive interposer layer 126 is formed of a material having relatively higher conductivity and relatively lower acoustic impedance. For example, the base electrode layer 122 may be formed of W, Ni—Fe, NbMo, or NiTi, and the conductive interposer layer 126 may be formed of Mo, although other materials and/or combinations of materials may be used without departing from the scope of the present teachings. In accordance with a representative embodiment, the selection of the material for the conductive interposer layer 126 is made to foster growth of highly textured piezoelectric material that forms piezoelectric layer 130. Further, in various embodiments, the base electrode layer 122 and the conductive interposer layer 126 may be formed of the same conductive material, without departing from the scope of the present teachings.

As should be appreciated by one of ordinary skill in the art, the electrical conductivity and the acoustic impedance depend on the material selected for the positive temperature coefficient material provided in the acoustic stack 105. Moreover, the acoustic impedance and electrical conductivity of the positive temperature coefficient material will impact its location in the acoustic stack 105. Typically, it is useful to provide a positive temperature coefficient material having a comparatively high acoustic impedance in order to achieve a higher acoustic coupling coefficient $kt^2$, thereby allowing a comparatively thin piezoelectric layer 130 to be provided in the acoustic stack 105. Moreover, it is useful to provide a positive temperature coefficient material having a comparatively low electrical resistance to avoid ohmic (resistive) losses in the acoustic resonator device 100. Finally, the present teachings contemplate the use of a multi-layer structure for the layer(s) of the acoustic stack 105 having a positive temperature coefficient to achieve comparatively high acoustic impedance and comparatively low electrical conductivity.

The temperature compensation layer 124 is considered a buried temperature compensating layer, in that it is formed between the base electrode layer 122 and the conductive interposer layer 126. The buried temperature compensation layer 124 is therefore separated or isolated from the piezoelectric layer 130 by the conductive interposer layer 126, and is otherwise sealed in by the connection between the conductive interposer layer 126 and the base electrode layer 122. Accordingly, the temperature compensation layer 124 is effectively buried within the composite first electrode 120.

As noted previously, at least one of the base electrode layer 122, the conductive interposer layer 126 and the second electrode 140 may be made of a material that has a positive temperature coefficient. As such, the second electrode 140 may be made of material having the positive temperature coefficient, while one or both of the base electrode layer 122 and the conductive interposer layer 126 are made of a material having a negative temperature coefficient. As noted above, the material having a positive temperature coefficient may be an alloy. Illustratively, the alloy may be one of nickel-iron (Ni—Fe), niobium-molybdenum (NbMo) and nickel-titanium (NiTi). The positive temperature coefficient of the second electrode 140 beneficially offsets negative temperature coefficients of other materials in the acoustic stack 105, including for example the piezoelectric layer 130 and any other layer of the acoustic stack 105 that has a negative temperature coefficient. Beneficially, the inclusion of one or more layers of materials having the positive temperature coefficient for electrically conductive layers in the acoustic stack 105 allows the same degree of temperature compensation with a thinner buried temperature compensation layer 124.

As shown in the representative embodiment of FIG. 1, the temperature compensation layer 124 and the seed interlayer 125 do not extend the full width of the acoustic stack 105. Also, the seed interlayer 125 does not extend the full width of the temperature compensation layer 124, but rather is positioned only on a portion of the top surface that is substantially parallel to the bottom surface of the piezoelectric layer 130. Thus, the conductive interposer layer 126, which is formed on the top surface of the seed interlayer 125 and the side surfaces of the temperature compensation layer 124, contacts the top surface of the base electrode layer 122, as indicated for example by reference number 129. Therefore, a DC electrical connection is formed between the conductive interposer layer 126 and the base electrode layer 122. By DC electrically connecting with the base electrode layer 122, the conductive interposer layer 126 effectively "shorts" out a capacitive component of the buried temperature compensation layer 124, thus increasing the coupling coefficient $kt^2$ of the acoustic resonator device 100. In addition, the conductive interposer layer 126 provides a barrier that prevents oxygen in the buried temperature compensation layer 124 from diffusing into the piezoelectric layer 130, preventing contamination of the piezoelectric layer 130.

Also, in the depicted embodiment, the buried temperature compensation layer 124 has tapered edges 124A, which enhance the DC electrical connection between the conductive interposer layer 126 and the base electrode layer 122. That is, at least one tapered edge 124A enabling at least a portion of the conductive interposer layer 126 to contact the base electrode layer 122. In addition, the tapered edges 124A enhance the mechanical connection between the conductive interposer layer 126 and the base electrode layer 122, which improves the sealing quality, e.g., for preventing oxygen in the buried temperature compensation layer 124 from diffusing into the piezoelectric layer 130. In alternative embodiments, the edges of the buried temperature compensation layer 124 are not tapered, but may be substantially perpendicular to the top and bottom surfaces of the temperature compensation layer 124, for example, without departing from the scope of the present teachings. In this configuration, the seed interlayer 125 may extend the full width or a portion of the full width of the temperature compensation layer 124.

The piezoelectric layer 130 is formed over the top surface of the conductive interposer layer 126. As mentioned above, the piezoelectric layer 130 is formed of AlN doped with Sc, the concentration of which is in a range of approximately 5.0 atomic percent to approximately 12 atomic percent of the material in the piezoelectric layer 130. The piezoelectric layer 130 may be grown or deposited over the upper surface of the base electrode layer 122 using one of a number of known methods, such as sputtering, for example, although the piezoelectric layer 130 may be fabricated according to any various techniques compatible with wafer processes.

The thickness of the piezoelectric layer 130 may range from about 1000 Å to about 100,000 Å, for example, although the thickness may vary to provide unique benefits for any particular situation or to meet application specific design requirements of various implementations, as would be apparent to one of ordinary skill in the art.

The second electrode 140 is formed on the top surface of the piezoelectric layer 130. The second electrode 140 is formed of an electrically conductive material compatible with wafer processes, such as Mo, W, Al, Pt, Ru, Nb, Hf, or the like. In an embodiment, the second electrode 140 is formed of the same material as the base electrode layer 122 of the composite first electrode 120. However, in various embodiments, the second electrode 140 may be formed of the same material as only the conductive interposer layer 126; the second electrode 140, the conductive interposer layer 126 and the base electrode layer 122 may all be formed of the same material; or the second electrode 140 may be formed of a different material than both the conductive interposer layer 126 and the base electrode layer 122, without departing from the scope of the present teachings.

The second electrode 140 may further include a passivation layer (not shown), which may be formed of various types of materials, including AlN, silicon carbide (SiC), BSG, SiO$_2$, SiN, polysilicon, and the like. Illustratively, the passivation layer may be as described by Miller et al., U.S. Pat. No. 8,330,556 (issued Dec. 11, 2012), which is hereby incorporated by reference in its entirety. The thickness of the passivation layer must be sufficient to insulate all layers of the acoustic stack 105 from the environment, including protection from moisture, corrosives, contaminants, debris and the like. The composite first 120 and second electrode 140 are electrically connected to external circuitry via contact pads (not shown), which may be formed of a conductive material, such as gold, gold-tin alloy or the like.

In an embodiment, an overall first thickness of the composite first electrode 120 is substantially the same as an overall second thickness of the second electrode 140, although in other embodiments the first and second overall thicknesses may differ from one another, as shown in FIG. 1. The thickness of each of the composite first electrode 120 and the second electrode 140 may range from about 600 Å to about 30000 Å, for example, although the thicknesses may vary to provide unique benefits for any particular situation or to meet application specific design requirements of various implementations, as would be apparent to one of ordinary skill in the art.

The multiple layers of the composite first electrode 120 have corresponding thicknesses. For example, the thickness of base electrode layer 122 may range from about 400 Å to about 29,900 Å, the thickness of temperature compensation layer 124 may range from about 100 Å to about 5000 Å, the thickness of seed interlayer 125 may range from about 5 Å to about 150 Å, and the thickness of conductive interposer layer 126 may range from about 100 Å to about 10000 Å. As a general consideration, the thickness of the layers of the acoustic stack 105 depend not only on the thickness of the buried temperature compensation layer 124, but also on the desired acoustic coupling coefficient kt$^2$, the targeted temperature response profile, and the frequency target of the acoustic resonator device 100. As such, the extent to which the thickness of the buried temperature compensation layer 124 can be reduced through the inclusion of one or more layers of the acoustic stack 105 that have a positive temperature coefficient depends on the magnitude of the positive temperature coefficient of the material used, the thickness(es) of the one or more layers of the acoustic stack 105 that have a positive temperature coefficient, the desired acoustic coupling coefficient kt$^2$, and the desired frequency target of the acoustic stack 105.

Each of the layers of the composite first electrode 120 may be varied to produce different characteristics with respect to temperature coefficients and coupling coefficients, while the overall first thickness of the composite first electrode 120 may be varied with the overall second thickness of the second electrode 140. As such, the first thickness of the composite first electrode 120 and overall second thickness of the second electrode 140 may be the same, or may differ depending on the desired temperature coefficient, acoustic coupling coefficient kt$^2$ and frequency target of the acoustic stack 105. Similarly, the thickness of the buried temperature compensation layer 124 may be varied to affect the overall temperature coefficient of the acoustic stack 105, and the relative thicknesses of the base electrode layer 122 and the conductive interposer layer 126 may be varied to affect the overall coupling coefficient of the acoustic resonator device 100.

According to various embodiments, the resonator device may be fabricated using various techniques compatible with wafer processes. A non-limiting example of a fabrication process directed to representative acoustic resonator device 100 is discussed below with reference to FIGS. 2A-2E.

FIGS. 2A-2E depicted an illustrative fabrication sequence for forming the base electrode layer 122, the buried temperature compensation layer 124 and the seed interlayer 125 is described. It is noted that the formation of the remaining portions of the configuration of the acoustic resonator device 100, such as the piezoelectric layer 130 and the second electrode 140, follow from the illustrative description in U.S. Patent Application Pub. No. 2014/0292149 (published Oct. 2, 2014), which is hereby incorporated by reference in its entirety.

Figure 2A:
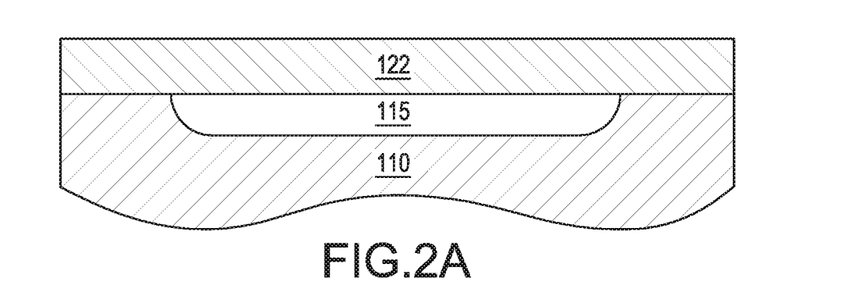
FIGS. 2A-2E are cross-sectional views illustrating a fabrication sequence for forming an acoustic resonator device, in accordance with a representative embodiment.

Referring to FIG. 2A, the substrate 110 may be formed of Si and the base electrode layer 122 may be formed of W, for example, although different materials may be used, as discussed above, without departing from the scope of the present teachings. The base electrode layer 122 may be applied to the substrate 110 using spin-on, sputtering, evaporation or chemical vapor disposition (CVD) techniques, for example, although other application methods may be incorporated.

Notably, formation of the cavity 115 in the substrate 110 may be carried out before fabrication of the acoustic stack 105 (including the base electrode layer 122), where the cavity 115 is initially filled with a sacrificial material (not shown), such as phosphosilicate glass (PSG) or other release processes, such as polysilicon and xenon difluoride etchant, as would be apparent to one of ordinary skill in the art. The release of the sacrificial material to form the cavity 115 is carried out using a suitable etchant, such as HF, after fabrication of the layers of the acoustic stack 105 (e.g., after formation of the second electrode 140). In alternative configurations, the cavity 115 may pass through the substrate 110 to form a backside opening, which may be formed by back side etching a bottom surface of the substrate 110. The back side etching may include a dry etch process, such as a Bosch process, for example, although various alternative techniques may be incorporated.

Alternatively, the substrate 110 may include an acoustic isolator, such as an acoustic mirror or a distributed Bragg reflectors (DBR), rather than the cavity 115. Such acoustic isolators may be formed in the substrate 110 using any technique compatible with wafer processes before forming the acoustic stack 105, as would be apparent to one of ordinary skill in the art.

Figure 2B:
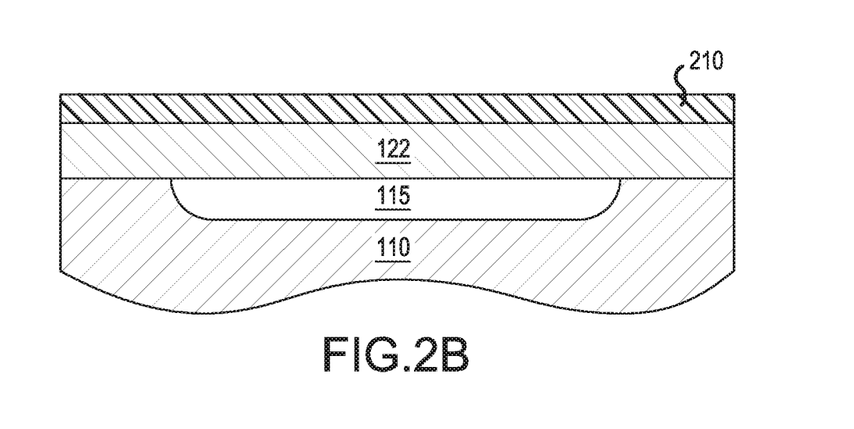

Referring to FIG. 2B, a layer 210 of material useful as the temperature compensation layer 124 is deposited over the base electrode layer 122. Layer 210 may be applied using any of various techniques, such as spin-on, sputtering, evaporation or CVD techniques, for example, although other application techniques may be incorporated. Examples of techniques for forming temperature compensating layers are described by Larson III et al., U.S. Pat. No. 7,561,009 (issued Jul. 14, 2009), which is hereby incorporated by reference in its entirety. In a representative embodiment, layer 210 is formed at a thickness of about 1000 Å using a thin film of BSG (e.g., about two percent by weight boron), which provides a large positive temperature coefficient (e.g., up to about 350 ppm per deg C.). PECVD or PVD $SiO_2$ may also be used as material for the temperature compensation layer 124. Notably, however if the temperature compensation layer 124 is made of $SiO_2$ as opposed to BSG, the thickness of the $SiO_2$ is approximately 20 percent greater than that of the BSG layer in order to achieve the same positive temperature compensation value. Each of the first overall thickness of the composite first electrode 120 and the second overall thickness of the second electrode 140 (including a passivation layer) may be about 3000 Å, for example.

Figure 2C:
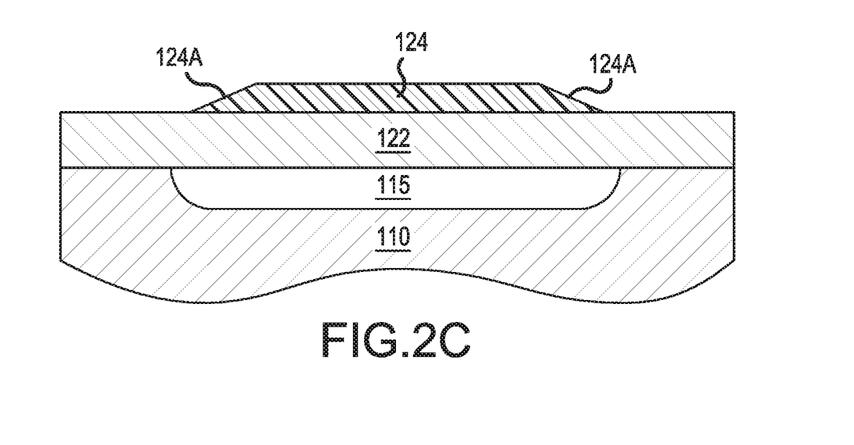

Referring FIG. 2C, the temperature compensation layer 124 is etched to a desired size, and the tapered edges 124A are tapered using standard wafer processing methods including photolithography, dry etching and photoresist strip, for example, as would be apparent to one of ordinary skill in the art. For example, a photoresist layer (not shown) may be applied to the top surface of the layer 210 and patterned to form a mask or photoresist pattern, using any phostoresist patterning technique compatible with wafer processes, as would be apparent to one of ordinary skill in the art. The photoresist pattern may be formed by machining or by chemically etching the photoresist layer using photolithography, although various alternative techniques may be incorporated. Following etching of the buried temperature compensation layer 124, the photoresist pattern is removed, for example, by chemically releasing or etching using a wet etch process, although the photoresist pattern may be removed by various other techniques, without departing from the scope of the present teachings.

In various embodiments, to obtain the tapered edges 124A, oxygen is leaked into the etchant used to etch the temperature compensation layer 124. The oxide (and/or temperature chuck) causes the photoresist to erode more quickly at the edges of the patterned photo resist and to pull back slightly. This "thinning" of the resist forms a wedge shape profile that is then imprinted into the oxide underneath as the photoresist goes away. Generally, the wedge is created by adjusting the etch rate of resist relative to the etched material, as would be apparent to one of ordinary skill in the art. Meanwhile, further from the edges of the buried temperature compensation layer 124, there is sufficient photoresist coverage throughout the etch that the underlying oxide material is not touched. Of course, other methods of obtaining tapered edges may be incorporated without departing from the scope of the present teachings.

Figure 2D:
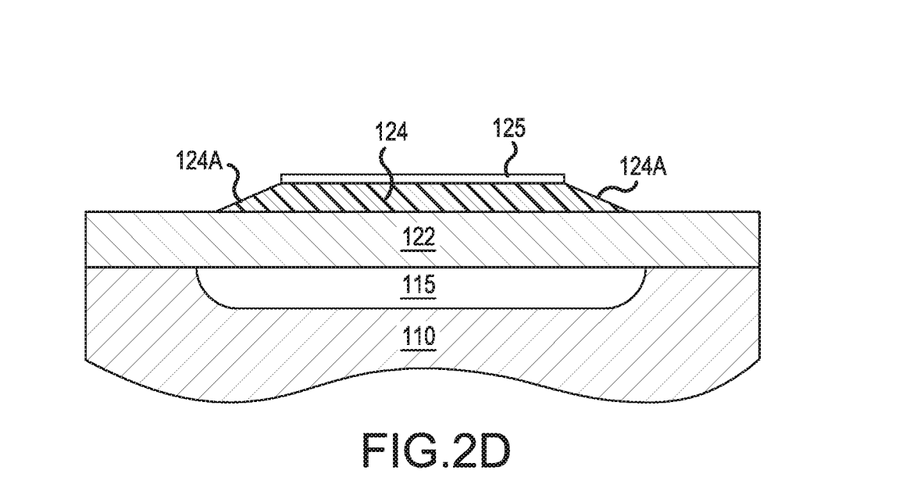

Referring to FIG. 2D, seed interlayer 125 is deposited over an upper surface of the temperature compensation layer 124, and patterned by a known method. As noted above, the seed interlayer 125 functions as a seed interlayer and may be formed of AlN or of the same piezoelectric material as the piezoelectric layer 130 (AlScN), for example. In a representative embodiment, the second interlayer may be formed to a thickness of about 30 Å, for example, although the seed interlayer 125 may have a thickness within the range of about 5 Å to about 150 Å. The seed interlayer 125 fosters the growth of a highly-textured (highly oriented C-axis) piezoelectric layer 130, reduces or minimizes oxide diffusion from the temperature compensation layer 124 into the piezoelectric layer 130, and working together with the AlScN material forming the piezoelectric layer 130, increases coupling coefficient $kt^2$.

Figure 2E:
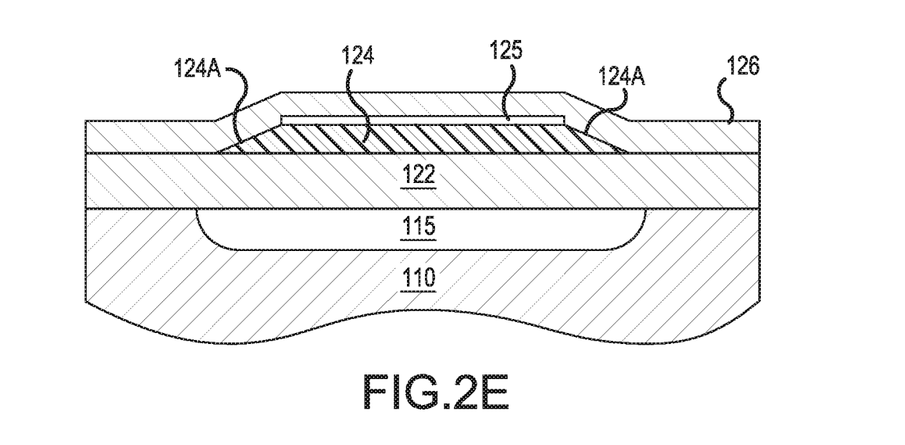

Outer portions of the seed interlayer 125 may be removed by etching to expose portions of the top surface of the temperature compensation layer 124 and the top surface of the base electrode layer 122. This results in the base electrode layer 122 making an electrical connection between with the conductive interposer layer 126, as shown in FIG. 2E. In other words, after etching, the seed interlayer 125 covers only the top surface of the temperature compensation layer 124 substantially parallel to the piezoelectric layer 130, so that it is positioned between the temperature compensation layer 124 and the conductive interposer layer 126.

In an embodiment, the base electrode layer 122 of the composite first electrode 120 and the second electrode 140 may each formed of Mo. The conductive interposer layer 126 may also made of Mo, and in this example would be between about 300 Å and about 600 Å. The piezoelectric layer 130 may be formed at a thickness of about 11,000 Å using a thin film of AlScN. The acoustic stack 105 with this illustrative configuration has a zero linear temperature coefficient value.

As described above, in a known structure, the piezoelectric layer may be formed of undoped AlN, and grown directly over the temperature compensation layer and the conductive interposer layer, without the intervening seed interlayer 125 of the representative embodiments. Typically, the temperature compensation layer is an amorphous layer (e.g., amorphous BSG) having no defined crystal orientation. When a piezoelectric layer is grown over an amorphous temperature compensation layer without the intervening interlayer, the resultant piezoelectric layer will have a poor C-axis orientation characterized by a random mixture of C-axis orientations in the piezoelectric layer. Such a piezoelectric layer may fail to provide a satisfactory piezoelectric response in some acoustic resonator applications. However, by providing the seed interlayer 125, e.g., formed of AlN, on top of temperature compensation layer 124 as described above, a more highly textured piezoelectric layer 130, formed of AlScN, is provided in the acoustic stack 105. Also, an enhanced acoustic coupling coefficient $kt^2$ is realized in acoustic resonator device 100, which increases as the thickness of the seed interlayer 125 decreases. Also, as discussed further below, another advantage is that variation of coupling coefficients $kt^2$ across a wafer decreases as the thickness of the seed interlayer 125 decreases.

Figure 3A:
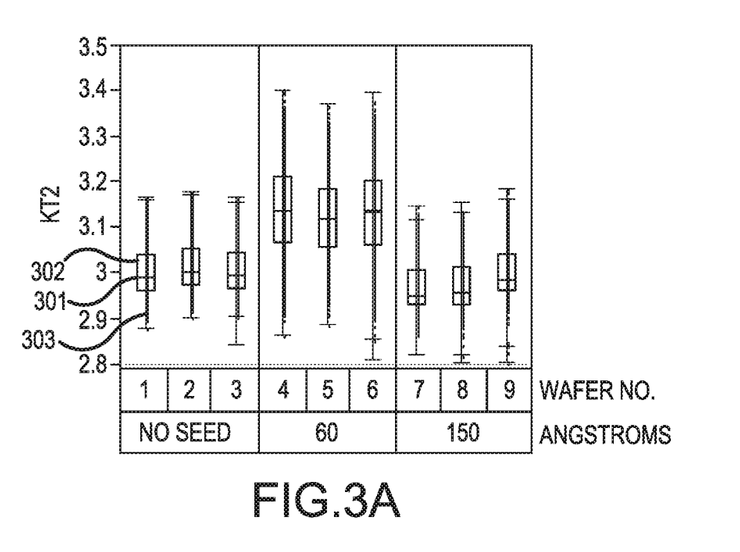
FIG. 3A is a diagram showing effective coupling coefficients of acoustic resonator devices as a function of seed interlayer thickness, where the piezoelectric layers are formed of AlN (not doped with Sc).
Figure 3B:
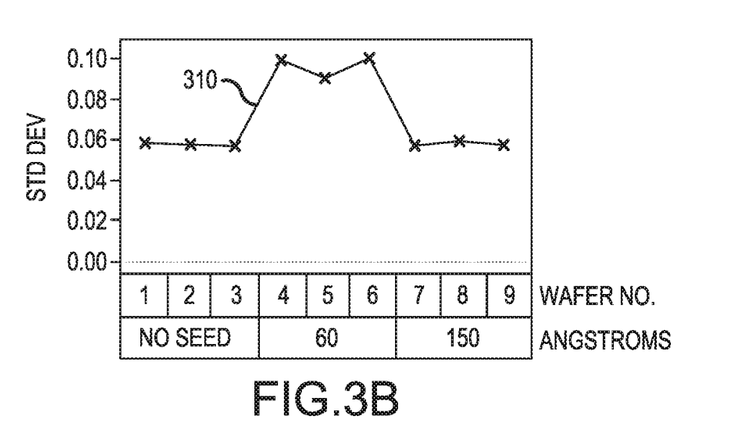
FIG. 3B is a diagram showing standard deviations across acoustic resonator device wafers as a function of seed interlayer thickness, where the piezoelectric layers are formed of AlN (not doped with Sc).

FIG. 3A is a diagram showing effective coupling coefficients $kt^2$ of acoustic resonator devices as a function of seed interlayer thickness, and FIG. 3B is a diagram showing standard deviations of effective coupling coefficients $kt^2$ across wafers, each of which comprises multiple acoustic resonator devices, as a function of seed interlayer thickness, where the piezoelectric layer of the acoustic stack is formed of a piezoelectric material (i.e., AlN) not doped with Sc. For purposes of illustration, the seed interlayer (if any) would be effectively the same as the seed interlayer 125, discussed above with reference to FIG. 1. Further, the acoustic stacks including the respective seed interlayers (if any) would be effectively the same structurally as the acoustic stack 105, including a temperature compensation layer 124 in a composite first electrode 120, although with a different piezoelectric material (i.e., AlN instead of AlScN).

Referring to FIG. 3A, characteristics of three sample wafers were measured for each of three seed interlayer configurations. Sample wafers 1-3 include no seed interlayers; sample wafers 4-6 include seed interlayers each having a thickness of approximately 60 Å; and sample wafers 7-9 include seed interlayers each having a thickness of approximately 150 Å. The seed interlayers are formed of AlN, and are arranged between a temperature compensation layer formed of $SiO_2$ and a conductive interposer layer formed of Mo, for purposes of illustration.

Each of the sample wafers 1-9 has corresponding graphical information arranged vertically over the numbers identifying the sample wafers 1-9. For purposes of illustration, sample wafer 1 will be referenced to explain the corresponding graphical information, which explanation likewise applies to the other sample wafers in the coupling coefficient diagrams (FIGS. 3A, 4A and 5A), as well as the sample wafers in the temperature compensation diagram (FIG. 4C), so this explanation will not be repeated. Referring to sample wafer 1 in FIG. 3A, a range of discrete measured values (in this case, a range of measured coupling coefficients $kt^2$ corresponding to multiple acoustic resonator devices in the sample wafer 1) is indicated by the box 302, a median value of the range of discrete measured values (e.g., the median coupling coefficient $kt^2$) is indicated by marker 301, and the coupling coefficient outliers of the measured values of the multiple acoustic resonator devices across the sample wafer 1 are indicated by vertical line 303. In the depicted example of sample wafer 1, the coupling coefficient $kt^2$ values range from about 2.95 percent to about 3.04 percent as shown by box 302, the median coupling coefficient $kt^2$ value is about 2.98 percent as shown by marker 301, and the coupling coefficient outlier values range from about 2.88 percent to about 3.17 percent as shown by vertical line 303.

FIG. 3A depicts some improvement in the coupling coefficients $kt^2$ of the acoustic resonator devices when the seed interlayers are approximately 60 Å thick (sample wafers 4-6), as compared to the wafers having no seed interlayers (sample wafers 1-3) and the wafers having seed interlayers approximately 150 Å thick (sample wafers 7-9). That is, sample wafers 4-6 have median coupling coefficient $kt^2$ values between 3.1 percent and 3.2 percent, while sample wafers 1-3 have median coupling coefficient $kt^2$ values of approximately 3.0, percent and sample wafers 7-9 have median coupling coefficient values $kt^2$ of less than 3.0 percent. Notably, though, the wafers with the highest coupling coefficients $kt^2$ have the worst variations across the wafers, respectively (i.e., the highest standard deviations). That is, as shown by the line 310 in FIG. 3B (which is formed by X's corresponding to the sample wafers 1-9, respectively), sample wafers 4-6 have standard deviations of about 0.09 percent and 0.10 percent, while sample wafers 1-3 and 7-9 have standard deviations of about 0.06 percent, where the lower standard deviations are more desirable.

In comparison, replacing the AlN piezoelectric layer with a doped AlScN piezoelectric layer (e.g., piezoelectric layer 130), together with reducing the thickness of the seed interlayer (e.g., seed interlayer 125), improves functional characteristics of the acoustic resonator devices significantly, including higher coupling coefficient $kt^2$ values and lower standard deviation values of coupling coefficient $kt^2$, while generally maintaining the same levels of temperature compensation, as indicated by FIGS. 4A-5B. The thinner seed interlayer is instrumental for the AlScN piezoelectric layer coupling coefficient $kt^2$ improvement, and indicates that Sc doped AlN piezoelectric layer growth differs from conventional AlN piezoelectric layer growth.

Figure 4A:
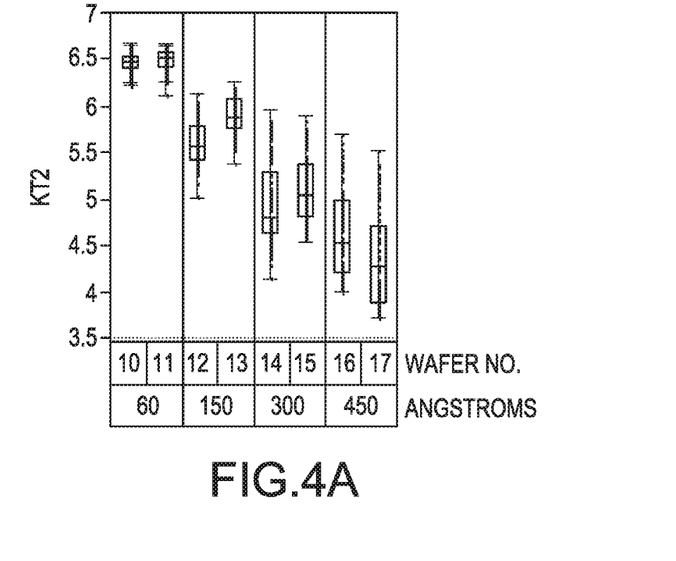
FIG. 4A is a diagram showing effective coupling coefficients of acoustic resonator devices as a function of seed interlayer thickness, where the piezoelectric layers are formed of AlN doped with Sc, according to representative embodiments.

FIG. 4A depicts substantial improvement in the coupling coefficients $kt^2$ of the acoustic resonator devices when the piezoelectric layer 130 is formed of AlScN and the seed interlayers are approximately 60 Å thick (sample wafers 10 and 11) and approximately 150 Å thick (sample wafers 12 and 13), as compared to the wafers having thicker seed interlayers of approximately 300 Å (sample wafers 14 and 15) and approximately 450 Å (sample wafers 16 and 17), and as compared to seed interlayers of the same thicknesses where the piezoelectric material is formed of AlN.

The acoustic resonator devices with AlScN piezoelectric layers (130) and thinner seed interlayers (125) have better functional characteristics than the acoustic resonator devices with AlScN piezoelectric layers and thicker seed interlayers. As observed above, sample wafers 10 and 11 with 60 Å seed interlayers have median coupling coefficient $kt^2$ values between about 6.5 percent and about 6.6 percent. In comparison, sample wafers 14 and 15 with 300 Å seed interlayers have median coupling coefficient $kt^2$ values of about 4.8 percent and about 5.0 percent, and sample wafers 16 and 17 with 450 Å seed interlayers have median coupling coefficient $kt^2$ values of about 4.3 percent and about 4.5 percent. Thus, the 60 Å seed interlayers provide about a 30 percent improvement in coupling coefficients $kt^2$ over the 300 Å seed interlayers, and about a 45 percent improvement over the 450 Å seed interlayers.

Figure 4B:
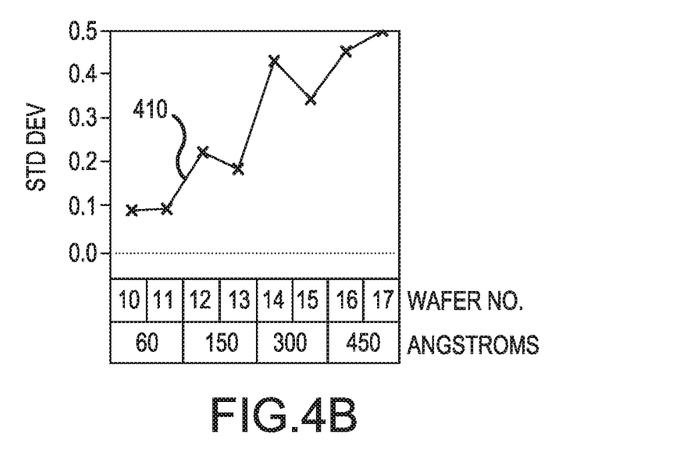
FIG. 4B is a diagram showing standard deviations of effective coupling coefficients across acoustic resonator device wafers as a function of seed interlayer thickness, where the piezoelectric layers are formed of AlN doped with Sc.

FIG. 4B depicts substantial improvement in the standard deviations of effective coupling coefficient $kt^2$ of acoustic resonator devices when the piezoelectric layer 130 is formed of AlScN and the seed interlayers are approximately 60 Å thick (sample wafers 10 and 11) and approximately 150 Å thick (sample wafers 12 and 13), as compared to the wafers having thicker seed interlayers of approximately 300 Å (sample wafers 14 and 15) and approximately 450 Å (sample wafers 16 and 17), and as compared to seed interlayers of the same thicknesses where the piezoelectric material is formed of AlN. That is, as shown by the line 410 in FIG. 4B (which is formed by X's corresponding to the sample wafers 10-17, respectively), sample wafers 10 and 11 with 60 Å seed interlayers have standard deviations between about 0.10 percent and about 0.11 percent, and sample wafers 12 and 13 with 150 Å seed interlayers have standard deviations between about 0.15 percent and about 0.21 percent. Meanwhile, sample wafers 14 and 15 with 300 Å seed interlayers have higher standard deviations of about 0.43 percent and about 0.35 percent, and sample wafers 16 and 17 with 450 Å seed interlayers have higher standard deviations of about 0.45 percent and about 0.50 percent. In comparison, referring to FIG. 3B, in which the piezoelectric layer of the acoustic stack is formed of AlN instead of AlScN, line 310 shows that the standard deviations of the sample wafers 4-6 (with 60 Å seed interlayers) are actually higher than the standard deviations of the sample wafers 7-9 (with 150 Å seed interlayers).

Figure 4C:
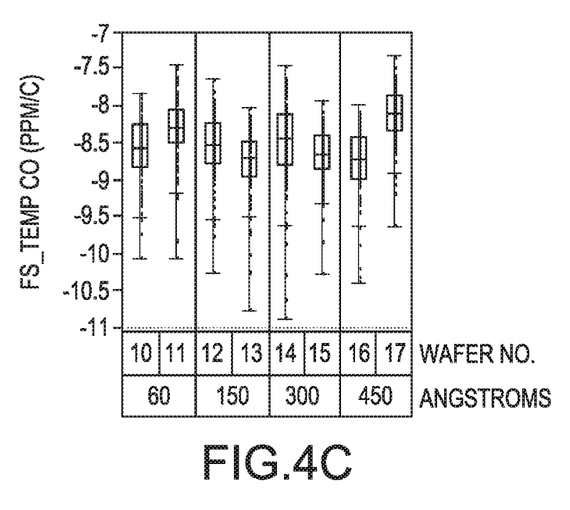
FIG. 4C is a diagram showing temperature coefficients of acoustic resonator devices as a function of seed interlayer thickness, where the piezoelectric layers are formed of AlN doped with Sc, according to representative embodiments.
Figure 4D:
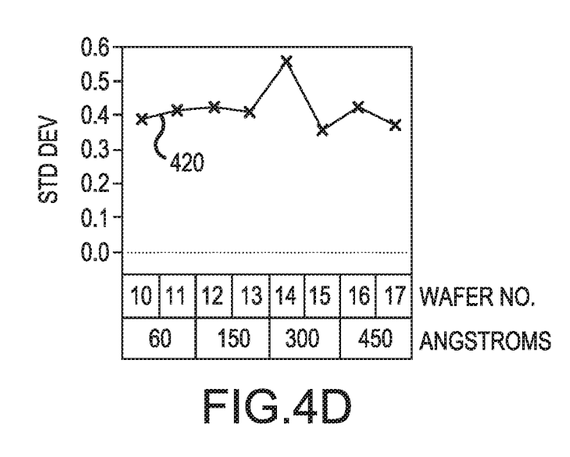
FIG. 4D is a diagram showing standard deviations of temperature coefficients across acoustic resonator device wafers as a function of seed interlayer thickness, where the piezoelectric layers are formed of AlN doped with Sc, according to representative embodiments.

FIG. 4C is a diagram showing changes in temperature coefficients of acoustic stacks as a function of seed interlayer thickness (measured by change in resistance in ppm with each degree Celsius of change in temperature), and FIG. 4D is a diagram showing standard deviations of temperature coefficients across wafers as a function of seed interlayer thickness, where the piezoelectric layers of the acoustic resonator devices are formed of Sc doped AlN piezoelectric material, as described above. Notably, as indicated by the graphical information in FIG. 4C and line 420 in FIG. 4D, the temperature coefficients remain relatively consistent regardless of the thicknesses of the seed interlayers. In other words, there are no negative repercussions with respect to temperature control for decreasing the thicknesses of the seed interlayers.

Thus, generally, in the same AlScN based acoustic stack, the thinner seed interlayer (e.g., formed of AlN) contributes to a higher median of coupling coefficient $kt^2$, and lower variations of coupling coefficient $kt^2$ across wafer. In the same AlN based stack, a thinner seed interlayer may contribute to a higher median of coupling coefficient $kt^2$, but does not contribute to lower coupling coefficient $kt^2$ variations across wafer.

Figure 5A:
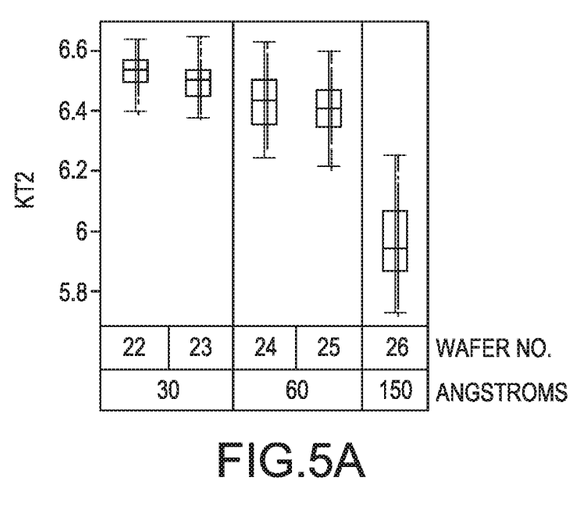
FIG. 5A is a diagram showing effective coupling coefficients of acoustic resonator devices as a function of seed interlayer thickness, where the piezoelectric layers are formed of AlN doped with Sc, according to representative embodiments.
Figure 5B:
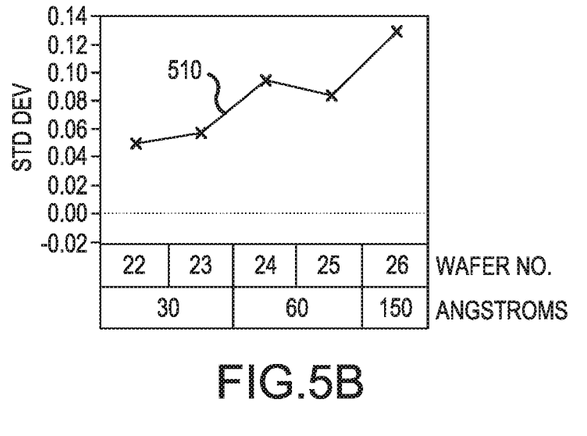
FIG. 5B is a diagram showing standard deviations of effective coupling coefficients across acoustic resonator device wafers as a function of seed interlayer thickness, where the piezoelectric layers are formed of AlN doped with Sc, according to representative embodiments.

FIGS. 5A and 5B are similar to FIGS. 4A and 4B, respectively, in that FIG. 5A is a diagram showing coupling coefficients $kt^2$ acoustic resonator devices as a function of seed interlayer thickness, and FIG. 5B is a diagram showing standard deviations across wafers, each of which comprises multiple acoustic resonator devices, as a function of seed interlayer thickness, where the piezoelectric layers of the acoustic resonator devices are formed of Sc doped AlN piezoelectric material, as described above. Generally, FIGS. 5A and 5B show even greater improvement when the thicknesses of the seed interlayers are decreased even further, e.g., from 150 Å and 60 Å to 30 Å.

FIG. 5A depicts improvement in the coupling coefficients $kt^2$ of the acoustic resonator devices when the piezoelectric layer 130 is formed of AlScN and the thicknesses of the seed interlayers are decreased to about 30 Å. That is, sample wafers 22 and 23 with 30 Å seed interlayers have median coupling coefficient $kt^2$ values of about 6.50 percent and about 6.52 percent, while sample wafers 24 and 25 with 60 Å seed interlayers have median coupling coefficient $kt^2$ values of about 6.42 and about 6.40 percent and sample wafer 26 with a 150 Å seed interlayer has a median coupling coefficient $kt^2$ value of about 5.88 percent. Again, there is also improvement in uniformity across the wafers, as indicated by line 510 in FIG. 5B showing corresponding standard deviations. That is, sample wafers 22 and 23 with 30 Å seed interlayers have standard deviations of about 0.05 percent and about 0.06 percent, while sample wafers 24 and 25 with 60 Å seed interlayers have higher standard deviations of about 0.09 percent and about 0.08 percent and sample wafer 26 with a 150 Å seed interlayer has a higher standard deviation of about 0.12. Thus generally, when using an AlScN piezoelectric layer in the acoustic stack, the thinner of the AlN seed interlayer in the composite bottom electrode, the higher the coupling coefficient $kt^2$ and the less variation of the coupling coefficient $kt^2$ across the wafer, while the temperature coefficient of the acoustic stack remains essentially the same.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An acoustic resonator device comprising:
a composite first electrode disposed over a substrate, the composite first electrode comprising:
a base electrode layer disposed over the substrate;
a temperature compensation layer disposed on the base electrode layer;
a seed interlayer disposed on the temperature compensation layer, the seed interlayer having a thickness between about 5 Å and about 150 Å; and
a conductive interposer layer disposed on at least the seed interlayer, at least a portion of the conductive interposer layer contacting the base electrode layer;
a piezoelectric layer disposed on the composite first electrode, the piezoelectric layer comprising a piezoelectric material doped with scandium (Sc) for improving piezoelectric properties of the piezoelectric layer; and
a second electrode disposed on the piezoelectric layer,
wherein the piezoelectric layer has a negative temperature coefficient and the temperature compensation layer has a positive temperature coefficient that at least partially offsets the negative temperature coefficient of the piezoelectric layer.

2. The acoustic resonator device of claim 1, wherein the piezoelectric layer comprises aluminum nitride (AlN) doped with scandium (Sc).

3. The acoustic resonator device of claim 2, wherein the seed interlayer comprises a piezoelectric material.

4. The acoustic resonator device of claim 3, wherein the seed interlayer comprises aluminum nitride (AlN).

5. The acoustic resonator device according to claim 3, wherein a concentration of scandium (Sc) is in a range of approximately 5.0 atomic percent to approximately 12 atomic percent of the piezoelectric material.

6. The acoustic resonator device of claim 1, wherein each of the temperature compensation layer and the seed interlayer are buried in the composite first electrode.

7. The acoustic resonator device of claim 2, wherein the temperature compensation layer comprises at least one tapered edge, enabling the at least a portion of the conductive interposer layer to contact the base electrode layer.

8. The acoustic resonator device of claim 1, wherein the temperature compensation layer comprises an oxide material.

9. The acoustic resonator device of claim 1, wherein the temperature compensation layer comprises a silicon oxide material.

10. The acoustic resonator device of claim 9, wherein the temperature compensation layer comprises one of silicon dioxide ($SiO_2$), borosilicate glass (BSG), fluorine doped $SiO_2$, chromium oxide ($Cr_{(x)}O_{(y)}$) or tellurium oxide ($TeO_{(x)}$).

11. The acoustic resonator device of claim 1, wherein the base electrode layer is formed of a first metal and the conductive interposer layer is formed of a second metal different from the first metal.

12. The acoustic resonator device of claim 11, wherein each of the base electrode layer and conductive interposer layer is formed of tungsten, molybdenum or aluminum.

13. The acoustic resonator device of claim 1, wherein the substrate defines a cavity over which the composite first electrode is positioned.

14. The acoustic resonator device of claim 1, further comprising:
an acoustic mirror disposed between the substrate and the composite first electrode, wherein the base electrode layer of the composite first electrode is disposed on the acoustic mirror.

15. The acoustic resonator device of claim 1, wherein the seed interlayer has a thickness between about 30 Å and about 50 Å.

16. An acoustic resonator device comprising:
a composite first electrode disposed over a substrate and an acoustic reflector formed in or on the substrate;
a piezoelectric layer disposed on the composite first electrode, the piezoelectric layer comprising piezoelectric material formed of aluminum nitride (AlN) doped with scandium (Sc); and
a second electrode disposed on the piezoelectric layer, wherein the composite first electrode comprises:
  a base electrode layer;
  a temperature compensation layer disposed on the base electrode layer, the temperature compensation layer having a positive temperature coefficient that at least partially offsets a negative temperature coefficient of the piezoelectric layer;
  a seed interlayer disposed on the temperature compensation layer, the seed interlayer being formed of aluminum nitride (AlN) having a thickness between about 5 Å and about 150 Å; and
  a conductive interposer layer disposed on at least the seed interlayer.

17. The acoustic resonator device of claim 16, wherein the seed interlayer causes the piezoelectric material to grow with a highly oriented C-axis, substantially perpendicular to a growth surface of the conductive interposer layer.

18. The acoustic resonator device of claim 16, wherein at least a portion of the conductive interposer layer contacts the base electrode layer.

19. The acoustic resonator device of claim 18, wherein the temperature compensation layer comprises at least one tapered edge, enabling the at least a portion of the conductive interposer layer to contact the base electrode layer.

20. The acoustic resonator device of claim 16, wherein the piezoelectric layer has a negative temperature coefficient and at least one of the base electrode layer, the conductive interposer layer and the second electrode has a positive temperature coefficient that offsets at least a portion of the negative temperature coefficient of the piezoelectric layer.

* * * * *